US009392696B2

(12) United States Patent
Chen

(10) Patent No.: US 9,392,696 B2
(45) Date of Patent: Jul. 12, 2016

(54) SEMICONDUCTOR PACKAGE

(71) Applicant: MEDIATEK Inc., Hsin-Chu (TW)

(72) Inventor: Nan-Jang Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/824,210

(22) Filed: Aug. 12, 2015

(65) Prior Publication Data

US 2015/0351245 A1 Dec. 3, 2015

Related U.S. Application Data

(63) Continuation-in-part of application No. 14/051,548, filed on Oct. 11, 2013, now Pat. No. 9,147,664.

(51) Int. Cl.

| H01L 23/48 | (2006.01) |
|---|---|
| H01L 23/52 | (2006.01) |
| H01L 29/40 | (2006.01) |
| H05K 1/18 | (2006.01) |
| H01L 23/367 | (2006.01) |
| H05K 1/11 | (2006.01) |
| H01L 23/498 | (2006.01) |

(Continued)

(52) U.S. Cl.
CPC ............ *H05K 1/181* (2013.01); *H01L 23/3107* (2013.01); *H01L 23/3121* (2013.01); *H01L 23/3675* (2013.01); *H01L 23/49827* (2013.01); *H01L 24/30* (2013.01); *H05K 1/0203* (2013.01); *H05K 1/114* (2013.01); *H01L 2924/12042* (2013.01); *H01L 2924/181* (2013.01); *H05K 2201/066* (2013.01); *H05K 2201/10287* (2013.01); *H05K 2201/10977* (2013.01)

(58) Field of Classification Search
CPC H05K 1/181; H01L 23/3675; H01L 23/4827; H01L 23/3107; H01L 24/30
USPC .......................................................... 257/774
See application file for complete search history.

(56) References Cited

U.S. PATENT DOCUMENTS 6,833,611 B2   12/2004  Liu et al.
6,833,615 B2   12/2004  Geng et al.
(Continued)

FOREIGN PATENT DOCUMENTS

CN   101083246 A   12/2007
CN   101728368 A   6/2010

OTHER PUBLICATIONS

International Search Report dated Jul. 8, 2014.
(Continued)

*Primary Examiner* — David S Blum
(74) *Attorney, Agent, or Firm* — McClure, Qualey & Rodack, LLP

(57) ABSTRACT

A semiconductor package includes a substrate, a first conductive layer, a second conductive layer, a first surface mount device, a second surface mount device and a connection element. The first conductive layer is formed on the substrate and has a first pad and a second pad separated from the first pad. The second conductive layer is formed on the substrate and has a third pad and a fourth pad electrically connected with the third pad through the second conductive layer. The first surface mount device is mounted on the first pad and the third pad. The second surface mount device is mounted on the second pad and the fourth pad. The connection element electrically connects the first pad with the second pad.

23 Claims, 11 Drawing Sheets

(51) Int. Cl.
  *H05K 1/02*    (2006.01)
  *H01L 23/31*   (2006.01)
  *H01L 23/00*   (2006.01)

(56) References Cited

U.S. PATENT DOCUMENTS

| | | |
|---|---|---|
| 7,009,297 B1 | 3/2006 | Chiang et al. |
| 2002/0047772 A1 | 4/2002 | Chang et al. |
| 2004/0032019 A1 | 2/2004 | Liu et al. |
| 2005/0035448 A1 | 2/2005 | Hsu et al. |
| 2006/0134828 A1 | 6/2006 | Kummerl |
| 2008/0305579 A1 | 12/2008 | Lin et al. |
| 2010/0295168 A1 | 11/2010 | Feng et al. |
| 2014/0240945 A1 | 8/2014 | Hosseini et al. |

OTHER PUBLICATIONS

Full English (machine) translation of CN101083246 (Published Dec. 5, 2007).

English Abstract translation of CN101728368 (Published Jun. 9, 2010).

"Spirent Communications"; Performance Analysis Broadband Division—Honolulu Development Center; PCB CAD Design Guidelines; Document 001-7001-001;Oct. 2, 2018.

SEMICONDUCTOR PACKAGE

This application is a continuation-in-part (CIP) application of U.S. application Ser. No. 14/051,548, now U.S. Pat. No. 9,147,664, filed on Oct. 11, 2013. The entire disclosure of U.S. application Ser. No. 14/051,548 is incorporated herein by reference.

BACKGROUND

1. Technical Field

The disclosure relates in general to a package structure, and more particularly to a semiconductor package.

2. Description of the Related Art

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical.

System-in-package (SiP) is now the fastest growing semiconductor package technology since it is a cost-effective solution to high-density system integration in a single package, such as the flip-chip ball grid array (FC-BGA) package or the wire-bonded BGA (WB-BGA) package. In a system-in-package structure, various device components are integrated in a single semiconductor package to reduce the size. Accordingly, there exists a need to provide a semiconductor package to overcomes, or at least reduces the above-mentioned problems.

SUMMARY

In one embodiment of the invention, a semiconductor package is provided. The semiconductor package includes a substrate, a first pad, a second pad, a first conductive element, a surface mount device, a first bonding wire, a second conductive element, a solder resistance layer and a heat-sink. The first pad is formed on the substrate. The second pad is formed on the substrate. The first conductive element is formed on the substrate. The surface mount device is mounted on the first pad and the second pad. The first bonding wire electrically connects a first bonding area of the first conductive element with a second bonding area of the first pad. The second conductive element is formed on the substrate and formed between the first pad and the first conductive element. The solder resistance layer covers a portion of the first bonding area and a portion of the second bonding area. The heat-sink is mounted on the substrate and has at least one cavity to accommodate the first pad, the second pad, a portion of the first conductive element, the bonding wire and the surface mount device.

Yet, in another embodiment of the invention, a semiconductor package is provided. The semiconductor package includes a substrate, a first pad, a second pad, a via-plug, a surface mount device and a heat-sink. The first pad is formed on the substrate. The second pad is formed on the substrate. The via-plug is formed in the substrate, covered by a solder resistance layer, located in a space between the first pad and the second pad, and electrically connected to the second pad. The surface mount device is mounted on the first pad and the second pad. The heat-sink is mounted on the substrate, having at least one cavity to accommodate the first pad, the second pad, a portion of the solder resistance layer and the surface mount device.

In yet another embodiment of the present invention, a semiconductor package is provided. The semiconductor package includes a substrate, a first conductive layer, a second conductive layer, a first surface mount device, a second surface mount device and a connection element. The first conductive layer is formed on the substrate and has a first pad and a second pad separated from the first pad. The second conductive layer is formed on the substrate and has a third pad and a fourth pad electrically connected with the third pad through the second conductive layer. The first surface mount device is mounted on the first pad and the third pad. The second surface mount device is mounted on the second pad and the fourth pad. The connection element electrically connects the first pad with the second pad.

In yet another embodiment of the present invention, a semiconductor package is provided. The semiconductor package includes a substrate, a first conductive layer, a second conductive layer, a first surface mount device, a second surface mount device, a first connection element and a second connection element. The first conductive layer is formed on the substrate and has a first pad and a second pad separated from the first pad. The second conductive layer is formed on the substrate and has a third pad and a fourth pad separated from the third pad. The first surface mount device is mounted on the first pad and the third pad. The second surface mount device is mounted on the second pad and the fourth pad. The first connection element electrically connects the first pad with the second pad. The second connection element electrically connects the third pad with the fourth pad.

In yet another embodiment of the present invention, a semiconductor package is provided. The semiconductor package includes a substrate, a first conductive layer, a second conductive layer, a connection element, a first surface mount device and a second surface mount device. The first conductive layer is formed on the substrate and has a first pad and a second pad separated from the first pad. The connection element electrically connecting the first pad with the second pad. The second conductive layer is formed on the substrate and has a third pad, a fourth pad and a fifth pad electrically connecting with each other through the second conductive layer. The first surface mount device is mounted on the first pad, the third pad and the fourth pad. The second surface mount device is mounted on the second pad and the fifth pad.

DETAILED DESCRIPTION

Figure 1A:
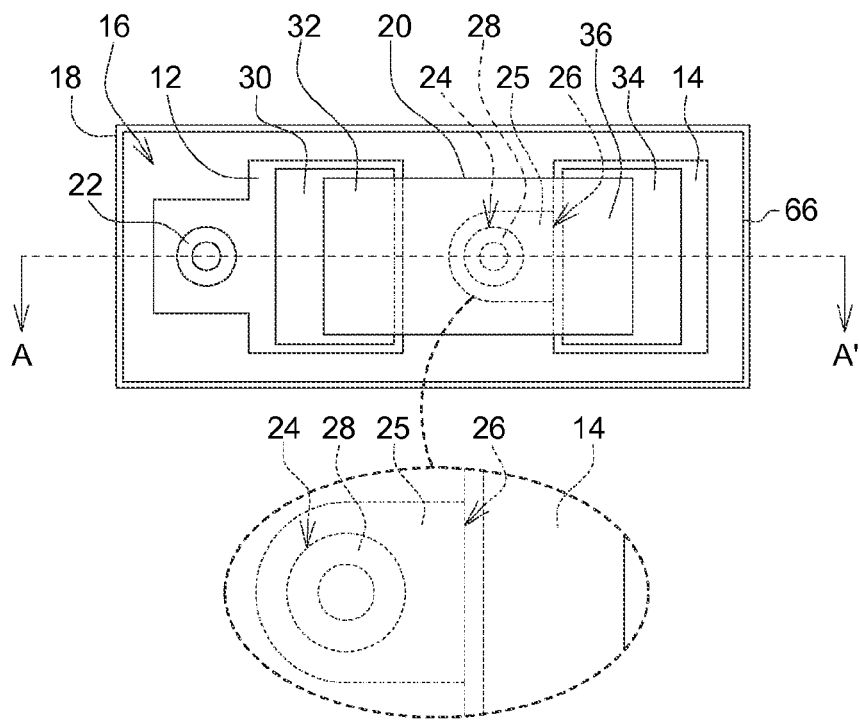
FIG. 1A illustrates a top view of a semiconductor package in one embodiment of the invention.
Figure 1B:
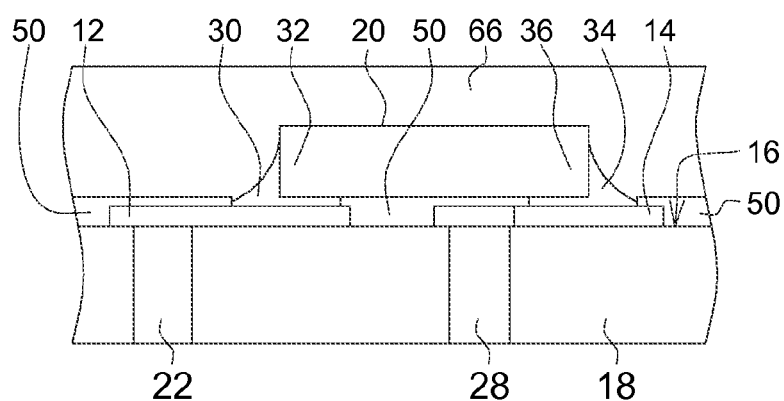
FIG. 1B illustrates a cross-section view of a semiconductor package in one embodiment of the invention.

FIG. 1A illustrates a top view of a semiconductor package in one embodiment of the invention. FIG. 1B illustrates a cross-section view of the semiconductor package drawn along AA' line in FIG. 1A.

Referring to FIG. 1A and FIG. 1B, a first pad 12 and a second pad 14 are disposed on a surface 16 of a substrate 18. The substrate 18 may be a printed circuit board (PCB), a semiconductor carrier board, or a package substrate such as a ball grid arrays (BGA) substrate or a pin grid array (PGA) substrate.

Referring to FIG. 1A and FIG. 1B, via-plugs 22, 28 passing through the substrate 18 are respectively electrically connected to the first pad 12 and the second pad 14, and may be electrically connected to conductive elements such as traces (not shown) on at least one other surface of the substrate 18. In one embodiment, the via-plugs 22, 28 passing through the whole substrate 18 are formed by a method comprising forming openings in the substrate by drilling, etching or emitting laser, and then filling the openings with a conductive material e.g. copper, aluminum, etc.

In one embodiment, the via-plug 28 is formed in a space between the first pad 12 and the second pad 14. And the via-plug 28 electrically connects to the second pad 14. Therefore, the space between the first pad 12 and the second pad 14 is used. It results in facilitating miniaturization of IC packages, or increasing of an extra area for additional elements or devices. Therefore, design flexibility of the semiconductor package is enhanced.

In one embodiment, the via-plug 28 is electrically connected to the second pad 14 through a connecting member 25, as shown in an enlarge view in FIG. 1A. Referring to FIGS. 1A and 1B, the connection member 25 may be formed together with the second pad 14. The via-plug 28 and the connection member 25 are covered by a solder resistance layer 50 (shown in FIG. 1B, but not shown in FIG. 1A for the sake of brevity). At least a portion of the first pad 12 and the second pad 14 is not covered by the solder resistance layer 50 (FIG. 1B) so as to reveal openings. In embodiments, the via-plug 28 and the second pad 14 are respectively formed in non-overlapping areas of the substrate 18, as shown in FIG. 1A. In other word, the via-plug 28 is independent from the second pad 14. An outline 24 of the via-plug 28 is generally a circle; an outline 26 of the second pad 14 is generally a square, but not limited thereto. The outline 24 of the via-plug 28 is independent from the outline 26 of the second pad 14. In other words, the outline 24 and the outline 26 are non-overlapping. In one embodiment, the outline 24 of the via-plug 28 and the outline 26 of the second pad 14 are separated by the connecting member 25.

Referring to FIGS. 1A and 1B, a surface mount device (SMD device) 20 may be mounted on the first pad 12 and the second pad 14 on the surface 16 of the substrate 18. The SMD device 20 may be a passive device e.g. capacitor, resistor, inductor or electrostatic discharge component (ESD). The SMD device 20 includes a first electrode 32 and a second electrode 36, which are respectively electrically connected to the first pad 12 through a first solder 30 and connected to the second pad 14 through a second solder 34. The SMD device 20 overlaps with the via-plug 28. In other word, the via-plug 28 is placed under the SMD device 20.

For example, the SMD device 20 is mounted on the surface 16 of the substrate 18 by a reflow process. In the beginning of the reflow process, a solder paste layer is printed in the openings defined by the solder resistance layer 50 on the first pad 12 and the second pad 14. The SMD device 20 then is mounted on the surface 16 by putting the first electrode 32 of the SMD device 20 on the solder paste layer which is printed on the first pad 12, and putting the second electrode 36 of the SMD device 20 on the solder paste layer which is printed on the second pad 14. Thereafter, the substrate 18 and the SMD device 20 are heated by a reflow oven. During the heating process, the solder past layer is melted to form the first solder 30 and the second solder 34. After cooling down, the first solder 30 and the second solder 34 firmly fix the SMD device 20 to the first pad 12 and the second pad 14.

In one embodiment, one of the first pad 12 and the second pad 14 is a power pad, and the other one is a ground pad. For example, the first pad 12 is the power pad, and the second pad 14 is the ground pad.

A molding compound layer 66 covers the substrate 18 and structures on the surface 16 of the substrate 18, so that various components such as the first pad 12, the second pad 14, the SMD device 20 etc., are encapsulated and protected from mechanical and/or chemical damages, e.g. moisture, oxidization, external shocks and vibrations. The molding compound layer 66 may include an epoxy resin or other suitable materials. In embodiments, the semiconductor package also includes other components not shown in FIGS. 1A and 1B.

Figure 2A:
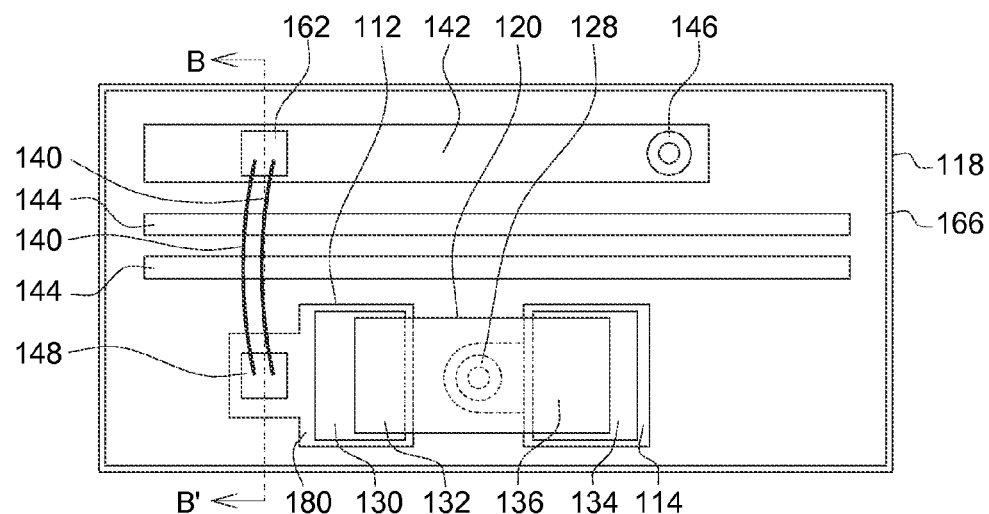
FIG. 2A illustrates a top view of a semiconductor package in one embodiment of the invention.
Figure 2B:
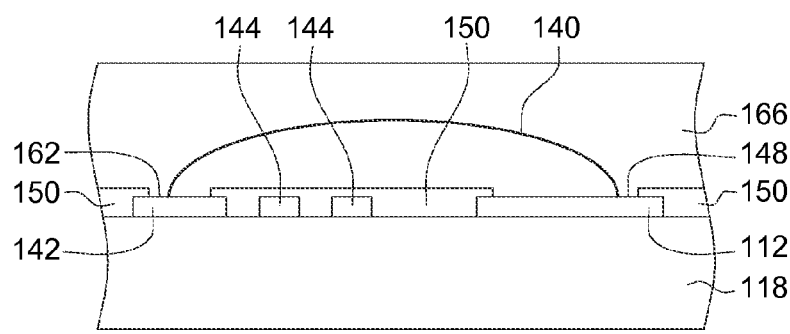
FIG. 2B illustrates a cross-section view of a semiconductor package in one embodiment of the invention.

FIG. 2A illustrates a top view of a semiconductor package in another embodiment of the invention. FIG. 2B illustrates a cross-section view of the semiconductor package drawn along BB' line in FIG. 2A.

The semiconductor package as shown in FIG. 2A includes a substrate 118. The substrate 118 may be a printed circuit board (PCB), a semiconductor carrier board, or a package substrate such as a ball grid arrays (BGA) substrate or a pin grid array (PGA) substrate. A surface mount device (SMD device) 120 may be mounted on a first pad 112 and a second pad 114 on the substrate 118 through a first solder 130 and a second solder 134, respectively electrically connected between a first electrode 132 of the SMD device 120 and the first pad 112 and between a second electrode 136 of the SMD device 120 and the second pad 114. The SMD device 120 may be a passive device e.g. capacitor, resistor, inductor or electrostatic discharge component (ESD).

As shown in FIG. 2A, the semiconductor package further includes a first conductive element 142 and maybe a second conductive element 144 formed on the substrate 118. The first conductive element 142 is formed physically independent from the first pad 112. The second conductive element 144 may be formed in between the first pad 112 and the first conductive element 142, and are separated from etch other, for example by an insulating layer such as a solder resistance layer 150 (FIG. 2B).

The first conductive element 142 electrically connects to a via-plug 146 formed through the substrate 118, and electrically connects to the first pad 112 through at least one bonding wire 140 lying across the second conductive element 144. In one embodiment, two opposing ends of the bonding wire 140 are respectively bonded on a first bonding area 148 connecting to the first pad 112 and a second bonding area 162 of the first conductive element 142. The first bonding area 148 and the second bonding area 162 are defined by the solder resistance layer 150 (shown in FIG. 2B, but not shown in FIG. 2A for the sake of brevity) which covers a portion of the substrate 118 and reveals some openings for soldering or wire bonding. The via-plugs 146, 128 (FIG. 2A) are formed through the substrate 118 and respectively electrically connected to the first conductive element 142 and the second pad 114.

As disclosed above, the SMD device 120 is mounted on the substrate 118 by reflow process. In order to prevent a solder paste material from flowing into the first bonding area 148, the solder resistance layer (not shown) may be used to cover an area 180 between the first bonding area 148 and the first pad 112.

In one embodiment, the first conductive element 142 and the second conductive element 144 may be a trace, a pad, a ring, or a finger. One of the first conductive element 142 and the second pad 114 is used for distributing power signal, and the other of the first conductive element 142 and the second pad 114 is used for connecting to a ground potential. For example, the second pad 114 is a ground pad. The first conductive element 142 is a power trace, a power ring, a power plane, or a power finger, electrically connected to the via-plug 146 or to the bonding pad on a semiconductor (not shown in FIG. 2A for the sake of brevity). In additional, the second conductive element 144 is a signal trace for distributing signal.

A molding compound layer 166 encapsulates structures on the substrate 118 such as the first pad 112, the second pad 114, the SMD device 120, the first conductive element 142, the second conductive element 144, etc., to protect them from mechanical and/or chemical damages, e.g. moisture, oxidization, external shocks and vibrations.

Figure 3A:
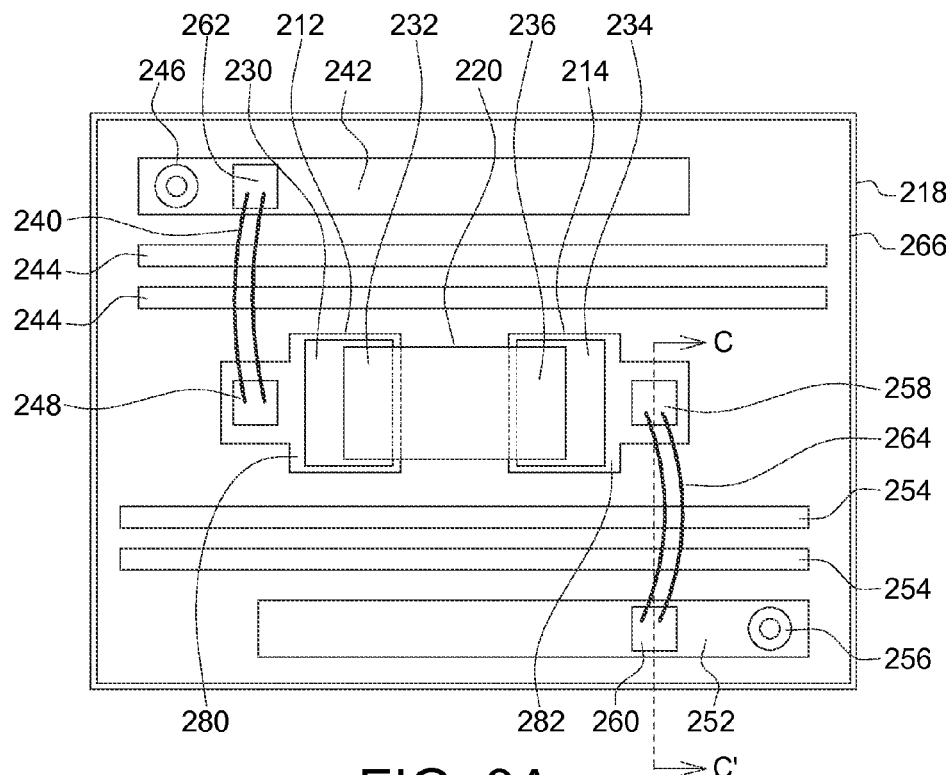
FIG. 3A illustrates a top view of a semiconductor package in one embodiment of the invention.
Figure 3B:
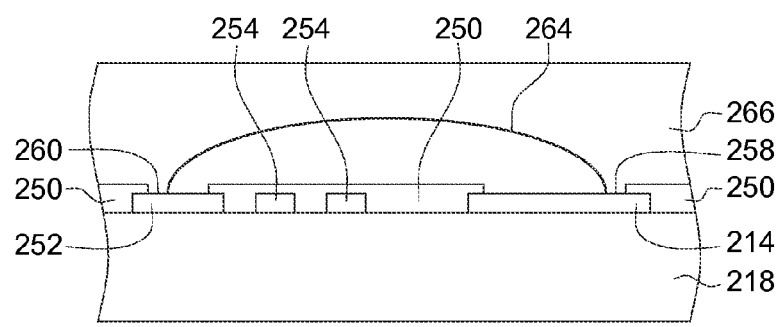
FIG. 3B illustrates a cross-section view of a semiconductor package in one embodiment of the invention.

FIG. 3A illustrates a top view of a semiconductor package in one embodiment of the invention. FIG. 3B illustrates a cross-section view of the semiconductor package drawn along CC' line in FIG. 3A.

The semiconductor package as shown in FIG. 3A includes a substrate 218. A surface mount device (SMD device) 220 may be mounted on a first pad 212 and a second pad 214 on the substrate 218 through a first solder 230 and a second solder 234, respectively electrically connected between a first electrode 232 of the SMD device 220 and the first pad 212 and between a second electrode 236 of the SMD device 220 and the second pad 214.

As shown in FIG. 3A, the semiconductor package further includes a first conductive element 242, a second conductive element 244, a third conductive element 252, and a fourth conductive element 254, formed on the substrate 218. The second conductive elements 244 are formed between the first pad 212 and the first conductive element 242, and are separated from each other, for example by an insulating layer such as a solder resistance layer 250 (FIG. 3B). The fourth conductive elements 254 are formed between the second pad 214 and the third conductive element 252, and are separated from each other, for example by an insulating layer such as the solder resistance layer 250 (FIG. 3B).

Moreover, the first conductive element 242 electrically connects to a via-plug 246 formed through the substrate 218, and electrically connects to the first pad 212 through at least one bonding wire 240 lying across the second conductive element 244. In one embodiment, two opposing ends of the bonding wire 240 are respectively bonded on a first bonding area 248 connecting to the first pad 212 and a second bonding area 262 of the first conductive element 242. The third conductive element 252 electrically connects to a via-plug 256 formed through the substrate 218, and electrically connects to the second pad 214 through at least one bonding wire 264 lying across the fourth conductive element 254. In one embodiment, two opposing ends of the bonding wire 264 are respectively bonded on a third bonding area 258 connecting to the second pad 214 and a fourth bonding area 260 of the third conductive element 252. In one embodiment, for example, the first bonding area 248, the second bonding area 262, the third bonding area 258 and the fourth bonding area 260 are defined by (or exposed by openings of) the solder resistance layer 250 (shown in FIG. 3B, but not shown in FIG. 3A for the sake of brevity).

As disclosed above, the SMD device 220 is mounted on the substrate 218 by reflow process. In order to prevent a solder paste material from flowing into the first bonding area 248 and the third bonding area 258, a solder resistance layer (not shown) may be used to cover an area 280 between the first bonding area 248 and the first pad 212, and cover an area 282 between the third bonding area 258 and the second pad 214.

Referring to FIG. 3A, one of the first conductive element 242 and the third conductive element 252 is used for distributing a power signal and the other of the first conductive element 242 and the third conductive element 252 is used for connecting to a ground potential. For example, the first conductive element 242 is a power trace, a power ring, a power plane, or a power finger, electrically connected to the via-plug 246. The third conductive element 252 is a ground trace, a ground ring, or a ground pad, electrically connected to the via-plug 256 or to the bonding pad on a semiconductor (not shown in FIG. 3A for the sake of brevity). The second conductive element 244 and the fourth conductive element 254 are signal traces for distributing signals.

A molding compound layer 266 encapsulates structures on the substrate 218 such as the first pad 212, the second pad 214, the SMD device 220, the first conductive element 242, the second conductive element 244, etc., to protect them from mechanical and/or chemical damages, e.g. moisture, oxidization, external shocks and vibrations.

Figure 4A:
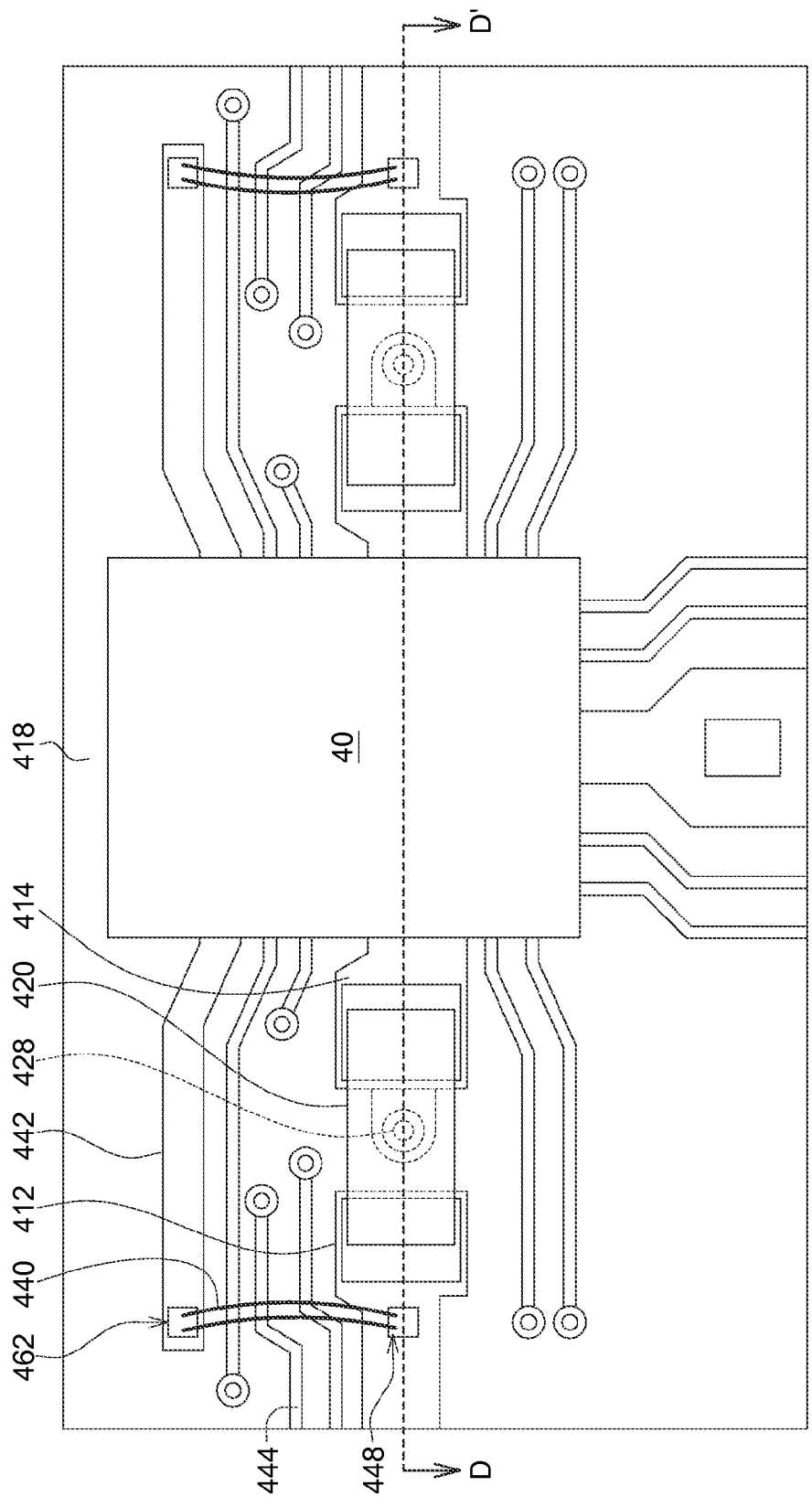
FIG. 4A is a top view illustrating a semiconductor package in accordance with one embodiment of the invention.
Figure 4B:
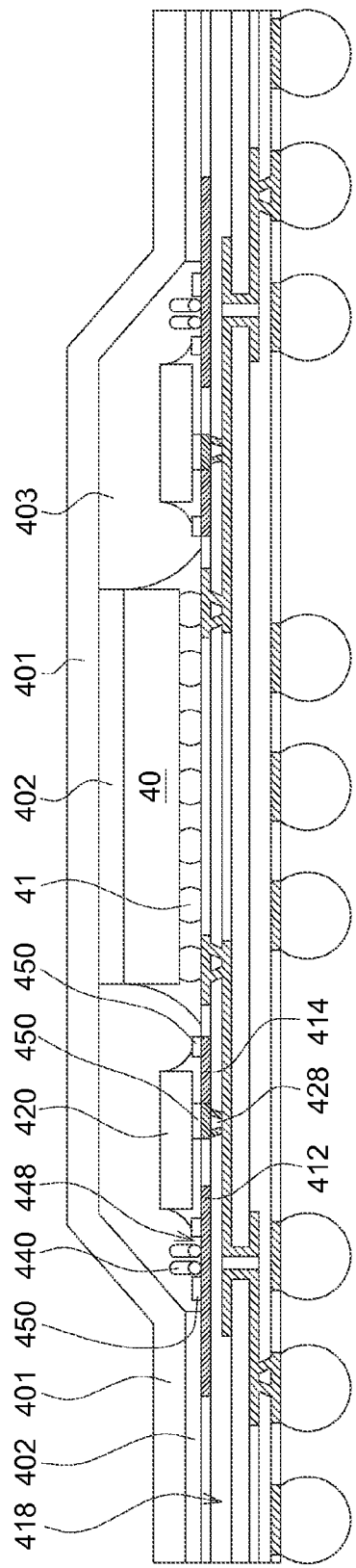
FIG. 4B is a cross-sectional view of the semiconductor package taken along DD' line depicted in FIG. 4A.

In some embodiments of the present invention, the semiconductor package further includes a heat-sink is mounted on the substrate. FIG. 4A is a top view illustrating a semiconductor package, named flip-chip ball grid array (FC-BGA) package, in accordance with one embodiment of the invention. FIG. 4B is a cross-sectional view of the semiconductor package taken along DD' line depicted in FIG. 4A. The structure of the semiconductor package depicted in FIG. 4 is similar to that of the semiconductor packages depicted in FIGS. 2A-2B, except that the semiconductor package of the present embodiment further has a heat-sink 401 (shown in FIG. 4B, but not shown in FIG. 4A for the sake of brevity) mounted on the substrate 418 rather than being encapsulated by a molding compound.

As shown in FIGS. 4A and 4B, the semiconductor package includes a substrate 418, a first pad 412, a second pad 414, a first conductive element 442, a surface mount device (SMD) 420, a first bonding wire 440, a second conductive element 444, a solder resistance layer 450, a via-plug 428 and a heat-sink 401. The first pad 412, the second pad 414, the first conductive element 442 are formed on the substrate 418. The surface mount device 420 is mounted on the first pad 412 and the second pad 414. The first bonding wire 440 electrically connects a first bonding area 462 of the first conductive element 442 with a second bonding area 448 of the first pad 412. The second conductive element 444 is formed on the substrate 418 and formed between the first pad 412 and the first conductive element 442. The via-plug 428 formed in the substrate 418, covered by a solder resistance layer 450, located in a space between the first pad 412 and the second pad 414, and electrically connected to the second pad 414.

In the present embodiment, the semiconductor package further includes a flip chip 40, such as a processing unit (CPU), bonded on the substrate 418 with solder bumps 41 and the surface mount device 420 may serve as a decoupling capacitor, disposed adjacent to the chip 40. The heat-sink 401 is mounted on a portion of the substrate 418 and the chip 40 by a thermal compound 402, and at least one cavity 403 are thus defined among the heat-sink 401, the chip 40 and the substrate 418 to accommodate the first pad 412, the second pad 414, a portion of the solder resistance layer 450 and the surface mount device 420 formed therein.

In one embodiment, one of the first pad 412 and the second pad 414 is a power pad, and the other one is a ground pad. The surface mount device 420 is a decoupling capacitor. For example, the first pad 412 is the power pad, and the second pad 414 is the ground pad.

Figure 5A:
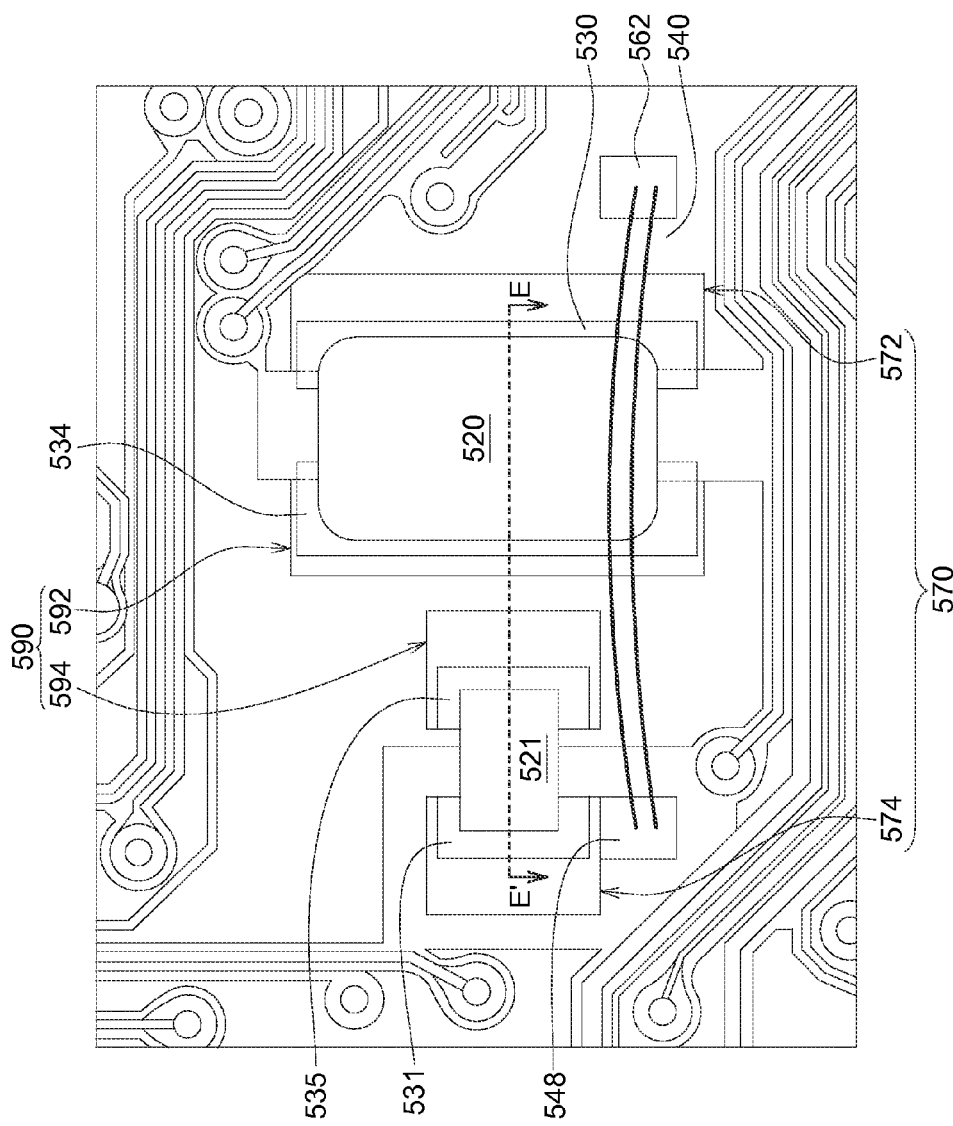
FIG. 5A is a top view illustrating a semiconductor package in accordance with one embodiment of the invention.
Figure 5B:
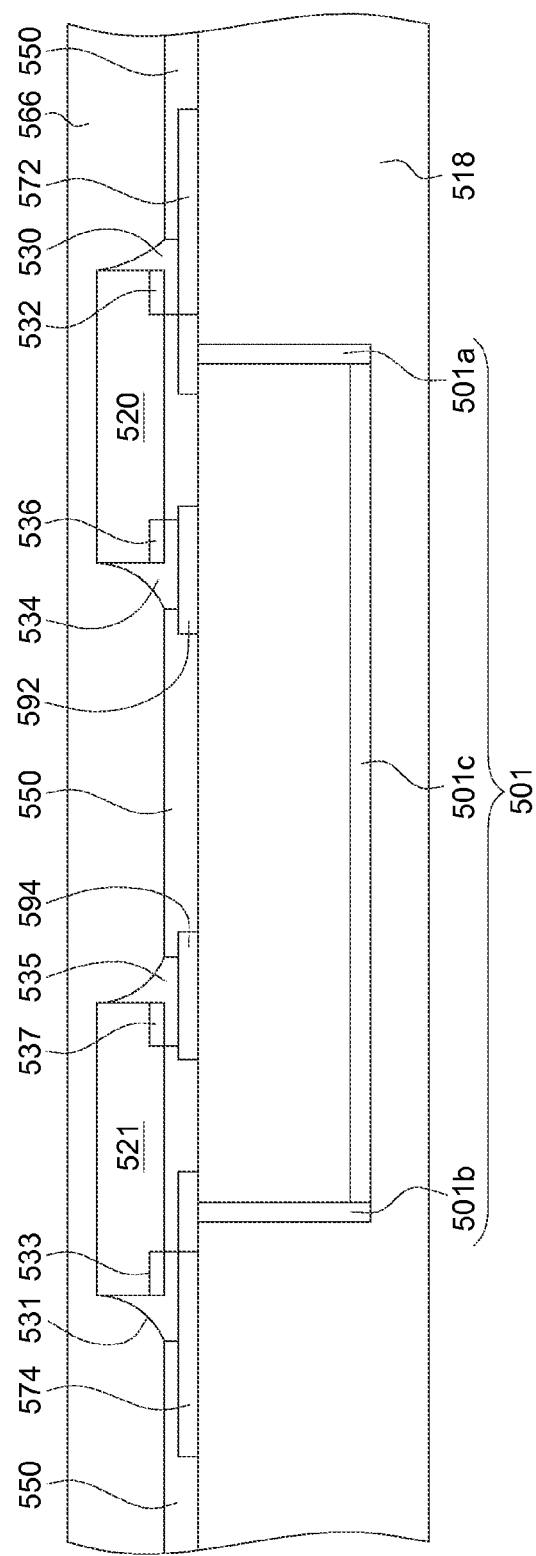
FIG. 5B is a cross-sectional view of the semiconductor package taken along EE' line depicted in FIG. 5A.

FIG. 5A is a top view illustrating a semiconductor package, which may be a FC-BGA package shown in FIG. 4 or a wire-bonded BGA package (not shown), in accordance with one embodiment of the invention. FIG. 5B is a cross-sectional view of the semiconductor package taken along EE' line depicted in FIG. 5A. As shown in FIG. 5A, the semiconductor package includes a substrate 518 having a first patterned conductive layer 570 and a second patterned conductive layer 590 formed thereon. The first patterned conductive layer 570 at least has a first pad 572 and a second pad 574 separated from the first pad 572; and the second patterned conductive layer 590 has a third pad 592 and a fourth pad 594 electrically connected with each other through the second patterned conductive layer 590. In other words, in the present embodiment, the first pad 572 and the second pad 574 has an identical level nevertheless they are not connected with each other; and the third pad 592 and the fourth pad 594 are defined on a continuous layer with the same level.

A first surface mount device (SMD device) 520 disposed on the substrate 518 may be mounted on the first pad 572 and the third pad 592 through a first solder 530 and a second solder 534, wherein the first solder 530 electrically connects a first electrode 532 of the surface mount device 520 with the first pad 572, and the second solder 534 electrically connects a second electrode 536 of the surface mount device 520 with the third pad 592. A second surface mount device 521 disposed on the substrate 518 may be mounted on the second pad 574 and the fourth pad 594 through a third solder 531 and a fourth solder 535, wherein the third solder 531 electrically connects a third electrode 533 of the second surface mount device 521 with the second pad 574, and the fourth solder 535 electrically connects a fourth electrode 537 of the second surface mount device 521 with the fourth pad 594 (shown in FIG. 5B, but not shown in FIG. 5 for the sake of brevity).

In some embodiments of the present invention, the first surface mount device 520 has a size substantially equal to that of the second surface mount device 521. But in the present embodiment, the first surface mount device 520 has a size substantially greater than that of the second surface mount device 521.

The first pad 572 electrically connects to the second pad 574 through at least one bonding wire 540. In one embodiment, two opposing ends of the bonding wire 540 are respectively bonded on a first bonding area 562 of the first pad 572 and a second bonding area 548 of the second pad 574. The first bonding area 562 and the second bonding area 548 are defined by a solder resistance layer 550 (shown in FIG. 5B, but not shown in FIG. 5A for the sake of brevity) which covers a portion of the first pad 572 and the second pad 574 to reveal some openings for soldering or wire bonding. In the present embodiment, the bonding wire 540 lies across the first surface mount device 520. The more the bonding wires 540 are bonded, the less the impedance between two bonding areas.

In some embodiments of the present invention, an interconnection structure 501 may be used to either substitute the bonding wire 540 or further electrically connect the first pad 572 with the second pad 574. In the present embodiment, the semiconductor package further includes an interconnection structure 501 having a plurality of via-plugs, such as via-plugs 501a and 501b, and a metal layer 501c formed in the substrate 518 used to further improved the electrical connection between the first pad 572 with the second pad 574 to reduce their impedance. The via-plugs 501a and 501b respectively in contact with the first pad 572 and the second pad 574; and one end of the metal layer 501c directly in contact with the via-plug 501a and the other end of the metal layer 501c directly in contact with the via-plug 501b.

In one embodiment, the first surface mount device 520 and the second surface mount device 521 are decoupling capacitors. The first pad 572 and the second pad 574 are the power pads, and the third pad 592 and the fourth pad 594 are the ground pads.

In some embodiments of the present invention, the semiconductor package may further include a molding compound layer 566 (shown in FIG. 5B, but not shown in FIG. 5A for the sake of brevity) encapsulating the structures formed on the substrate 518, such as a portion of the substrate, the first pad 572, the second pad 574, the third pad 592, the fourth pad 594, the bonding wire 540, the first surface mount device 520 and the second surface mount device 521.

Yet, in some embodiments of the present invention, the semiconductor package may further include a heat-sink mounted (like the one as shown in FIG. 4B) on the substrate 518, having at least one cavity 403 to accommodate the first pad 572, the second pad 574, the third pad 592, the fourth pad 594, the bonding wire 540, a portion of the solder resistance layer 550, the first surface mount device 520 and the second surface mount device 521.

Figure 6A:
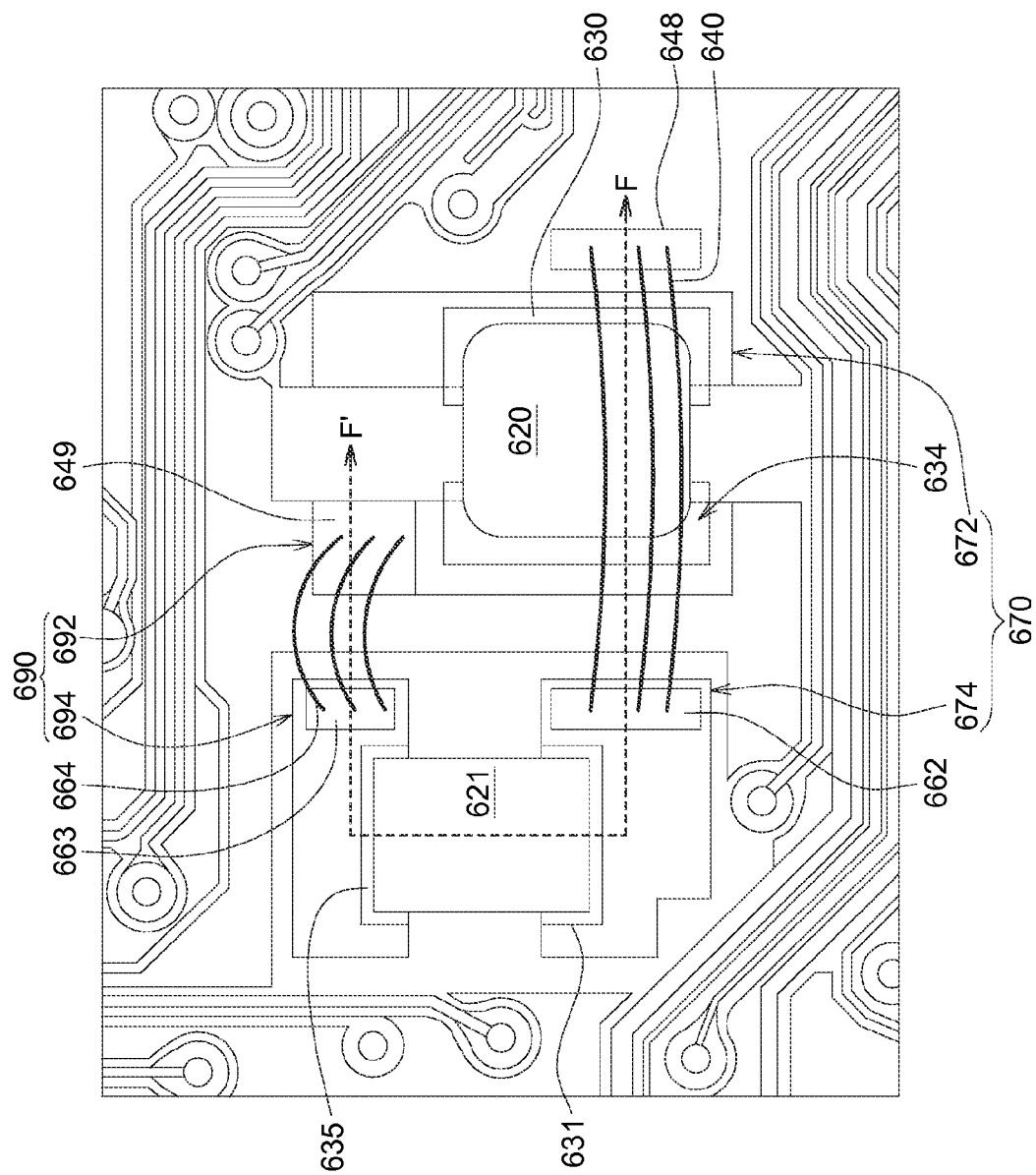
FIG. 6A is a top view illustrating a semiconductor package in accordance with one embodiment of the invention.
Figure 6B:
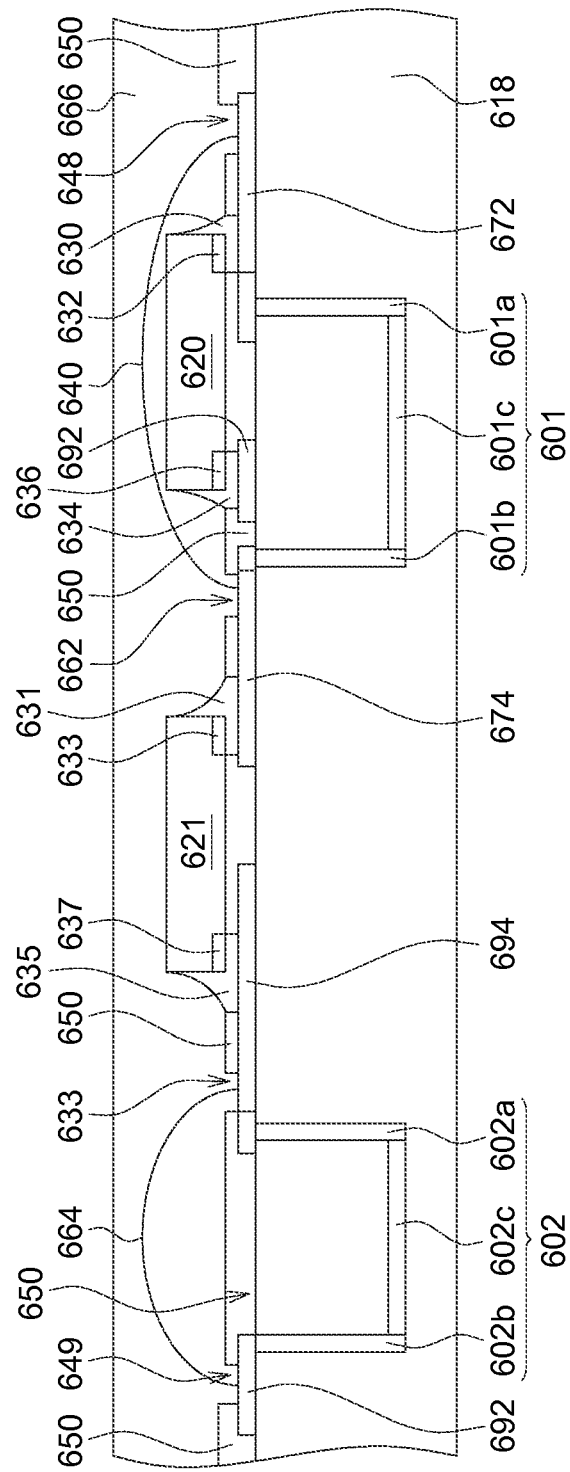
FIG. 6B is a cross-sectional view of the semiconductor package taken along FF' line depicted in FIG. 6A.

FIG. 6A is a top view illustrating a semiconductor package, which may be a FC-BGA package shown in FIG. 4 or a wire-bonded BGA package (not shown), in accordance with one embodiment of the invention. FIG. 6B is a cross-sectional view of the semiconductor package taken along FF' line depicted in FIG. 6A. As shown in FIG. 6A the semiconductor package includes a substrate 618 having a first patterned conductive layer 670 and a second patterned conductive layer 690 formed thereon. The first patterned conductive layer 670 at least has a first pad 672 and a second pad 674 separated from the first pad 672; and the second patterned conductive layer 690 has a third pad 692 and a fourth pad 694 separated from the third pad 692. In other words, in the present embodiment, the first pad 672 and the second pad 674 has an identical level nevertheless they are not connected with each other; and the third pad 692 and the fourth pad 694 are also not connected with each other but has the same level.

A first surface mount device (SMD device) 620 disposed on the substrate 618 may be mounted on a first pad 672 and the third pad 692 through a first solder 630 and a second solder 634, wherein the first solder 630 electrically connects a first electrode 632 of the first surface mount device 620 with the first pad 672, and the second solder 634 electrically connects a second electrode 636 of the first surface mount device 620 with the third pad 692. A second surface mount device 621 disposed on the substrate 618 may be mounted on the second pad 674 and the fourth pad 694 through a third solder 631 and a fourth solder 635. In the present embodiment, the third solder 631 electrically connects a third electrode 633 of the second surface mount device 621 with the second pad 674, and the fourth solder 635 electrically connects a fourth electrode 637 of the second surface mount device 621 with the fourth pad 694 (shown in FIG. 6B, but not shown in FIG. 6A for the sake of brevity).

In some embodiments of the present invention, the first surface mount device 620 has a size substantially equal to that of the second surface mount device 621. But in the present embodiment, the first surface mount device 620 has a size substantially greater than that of the second surface mount device 621.

The first pad 672 electrically connects to the second pad 674 through at least one first bonding wire 640; and the third pad 692 electrically connects to the fourth pad 694 through at least one second bonding wire 664. In one embodiment, two opposing ends of the first bonding wire 640 are respectively bonded on a first bonding area 648 of the first pad 672 and a second bonding area 662 of the second pad 674; and the two opposing ends of the second bonding wire 664 are respectively bonded on a third bonding area 649 of the third pad 692 and a fourth bonding area 663 of the second pad 674. The first bonding area 648, the second bonding area 662, the third bonding area 649 and the fourth bonding area 663 are defined by a solder resistance layer 650 (shown in FIG. 6B, but not shown in FIG. 6A for the sake of brevity) which covers a portion of the first pad 672, the second pad 674, the third pad 692 and the fourth pad 694 to reveal some openings for soldering or wire bonding. In the present embodiment, the first bonding wire 640 lies across the first surface mount device 620. The more the bonding wires 640 and 664 are bonded, the less the impedance between two bonding areas.

In some embodiments of the present invention, the first bonding wire 640 and the second bonding wire 664 may be respectively substituted by an interconnection structure. In one preferred embodiment, the semiconductor package may further include a first interconnection structure 601 and a second interconnection structure 602 respectively used to electrically connect the first pad 672 and the second pad 674 and to electrically connect the third pad 692 and the fourth pad 694 to reduce their impedance.

In the present embodiment, the interconnection structure 601 has a plurality of via-plugs, such as via-plugs 601a and 601b and a metal layer 601c. The via-plugs 601a and 601b respectively in contact with the first pad 672 and the second pad 674; and one end of the metal layer 601c directly in contact with the via-plug 601a and the other end of the metal layer 601c directly in contact with the via-plug 601b. The interconnection structure 602 has a plurality of via-plugs, such as via-plugs 602a and 602b and metal layer 602c. The via-plugs 602a and 602b respectively in contact with the third pad 692 and the fourth pad 694; and one end of the metal layer 602c directly in contact with the via-plug 602a and the other end of the metal layer 602c directly in contact with the via-plug 602b.

In one embodiment, the first surface mount device 620 and the second surface mount device 621 are decoupling capacitors. The first pad 672 and the second pad 674 are the power pads, and the third pad 692 and the fourth pad 694 are the ground pads.

In some embodiments of the present invention, the semiconductor package may further include a molding compound layer 666 (shown in FIG. 6B, but not shown in FIG. 6A for the sake of brevity) encapsulating the structures formed on the substrate 618, such as a portion of the substrate, the first pad 672, the second pad 674, the third pad 692, the fourth pad 694, the first bonding wire 640, the second bonding wire 664, a portion of the solder resistance layer 650, the first surface mount device 620 and the second surface mount device 621.

Yet, in some embodiments of the present invention, the semiconductor package may further include a heat-sink mounted (like the one 401 as shown in FIG. 4B) on the substrate 618, having at least one cavity 403 to accommodate the first pad 672, the second pad 674, the third pad 692, the fourth pad 694, the first bonding wire 640, the second bonding wire 664 the first surface mount device 620 and the second surface mount device 621.

Figure 7A:
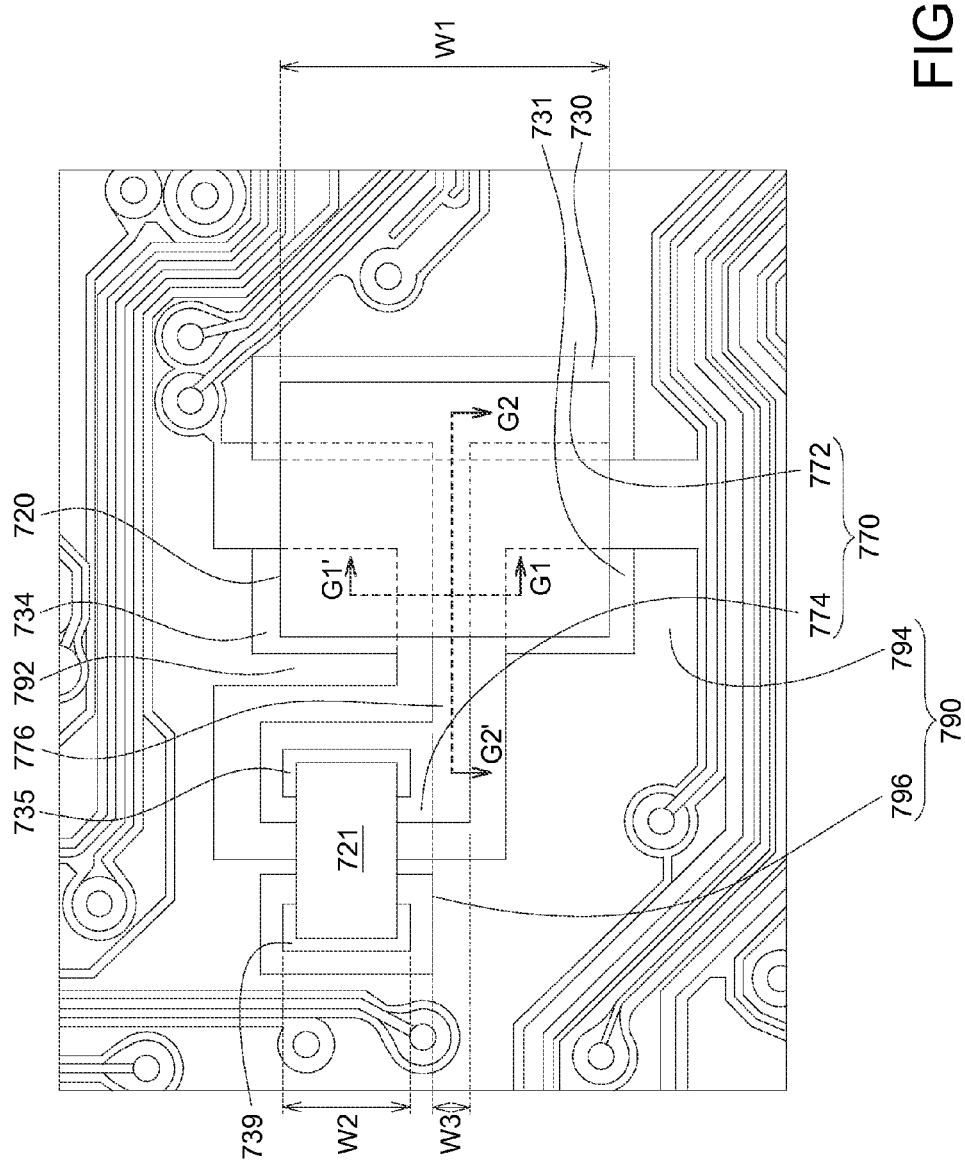
FIG. 7A is a top view illustrating a semiconductor package in accordance with one embodiment of the invention.
Figure 7B:
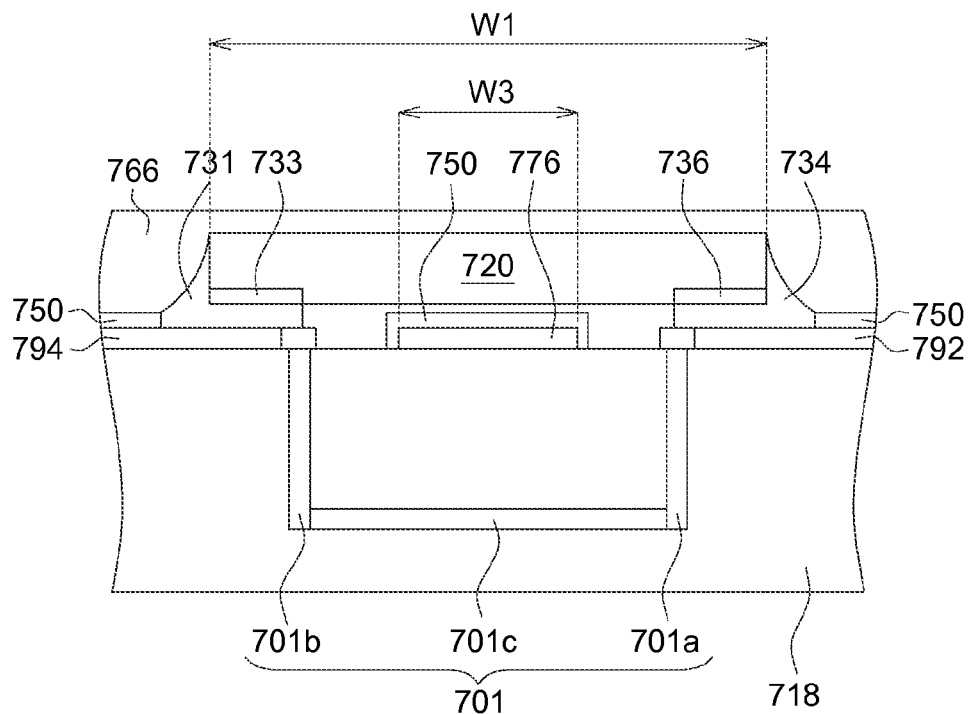
FIG. 7B is a cross-sectional view of the semiconductor package taken along G1G1' line depicted in FIG. 7A.
Figure 7C:
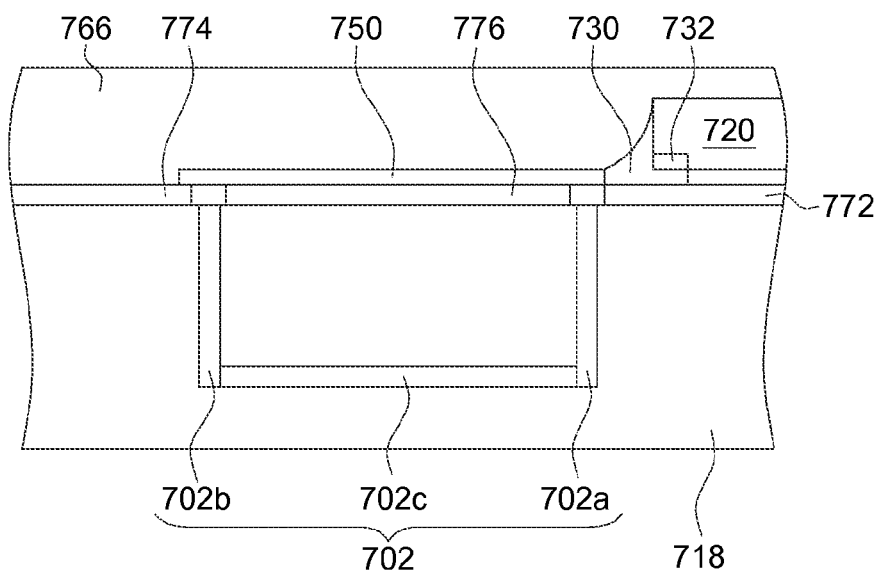
FIG. 7C is a cross-sectional view of the semiconductor package taken along G2G2' line depicted in FIG. 7A.

FIG. 7A is a top view illustrating a semiconductor package, which may be a FC-BGA package shown in FIG. 4 or a wire-bonded BGA package (not shown), in accordance with one embodiment of the invention. FIG. 7B is a cross-sectional view of the semiconductor package taken along G1G1' line depicted in FIG. 7A. FIG. 7C is a cross-sectional view of the semiconductor package taken along G2G2' line depicted in FIG. 7A. As shown in FIG. 7A the semiconductor package includes a substrate 718 having a first patterned conductive layer 770 and a second patterned conductive layer 790 formed thereon. The first patterned conductive layer 770 at least has a first pad 772, a second pad 774 and a connection element 776 electrically connecting the first pad 772 with the second pad 774; and the second patterned conductive layer 790 has a third pad 792, a fourth pad 794 and a fifth pad 796 electrically connecting with each other through the second patterned conductive layer 790. In other words, in the present embodiment, the first pad 772 and the second pad 774 are defined on a continuous layer with the same level; and the third pad 792 the fourth pad 794 and the fifth pad 796 are defined on a continuous layer with the same level.

A first surface mount device (SMD device) 720 disposed on the substrate 718 may be mounted on a first pad 772, the third pad 792 and the fourth pad 794 through a first solder 730, a second solder 734 and a third solder 731, wherein the first solder 730 electrically connects a first electrode 732 of the first surface mount device 720 with the first pad 772; the second solder 734 electrically connects a second electrode 736 of the first surface mount device 720 with the third pad 792; and the third solder 731 electrically connects a third electrode 733 of the first surface mount device 720 with the fourth pad 794. A second surface mount device 721 disposed on the substrate 718 may be mounted on the second pad 774 and the fifth pad 796 through a fourth solder 735 and a fifth solder 739. In the present embodiment, the fourth solder 735 electrically connects a fourth electrode (not shown) of the second surface mount device 721 with the second pad 774, and the fifth solder 739 electrically connects a fifth electrode (not shown) of the second surface mount device 721 with the fifth pad 796.

In some embodiments of the present invention, the first surface mount device 720 has a size substantially equal to that of the second surface mount device 721. But in the present embodiment, the first surface mount device 720 has a size substantially greater than that of the second surface mount device 721. For example, the first surface mount device 720 may have a width W1 substantially ranging from 0.6 to 6.4 mm; and the second surface mount device 721 may have a width W2 substantially ranging from 0.2 to 3.2 mm. In the present embodiment, the first surface mount device 720 preferably has a width W1 about 1 mm and 1 µF (capacitance), and the second surface mount device 721 may have a width W2 about 0.3 mm and 0.1 µF (capacitance). The connection element 776 covered with the solder resistance layer 750 has a width W3 substantially less than or equal to 600 µm (see FIG. 7B).

In some embodiments of the present invention, an interconnection structure 702 (see FIG. 7C) may be used to either substitute the connection element 776 or further electrically connect the first pad 772 with the second pad 774 to reduce their impedance. In one preferred embodiment, the semiconductor package may further include a first interconnection structure 702 and a second interconnection structure 701 respectively used to electrically connect the first pad 772 and the second pad 774 and to electrically connect the third pad 792 and the fourth pad 794 to reduce their impedance.

In the present embodiment, the interconnection structure 701 has a plurality of via-plugs, such as via-plugs 701a and 701b and a metal layer 701c. The via-plugs 701a and 701b respectively in contact with the third pad 792 and the fourth pad 794; and one end of the metal layer 701c directly in contact with the via-plug 701a and the other end of the metal layer 701c directly in contact with the via-plug 701b (see FIG. 7B). The interconnection structure 702 has a plurality of via-plugs, such as via-plugs 702a and 702b and metal layer 702c. The via-plugs 702a and 702b respectively in contact with the first pad 772 and the second pad 774; and one end of the metal layer 702c directly in contact with the via-plug 702a and the other end of the metal layer 702c directly in contact with the via-plug 702b. (see FIG. 7C).

In one embodiment, the first surface mount device 720 and the second surface mount device 721 are decoupling capacitors. The first pad 772 and the second pad 774 are the power pads, and the third pad 792, the fourth pad 794 and the fifth pad 796 are the ground pads.

In some embodiments of the present invention, the semiconductor package may further include a molding compound (shown in FIGS. 7B and 7C, but not shown in FIG. 7A for the sake of brevity) layer encapsulating the structures formed on the substrate 718, such as a portion of the substrate, the first pad 772, the second pad 774, the connection element 776, the third pad 792, the fourth pad 794, the fifth pad 796, the first surface mount device 720 and the second surface mount device 721.

Yet, in some embodiments of the present invention, the semiconductor package may further include a heat-sink mounted (like the one as shown in FIG. 4B) on the substrate 718, having at least one cavity 403 to accommodate the first pad 772, the second pad 774, the connection element 776, the third pad 792, the fourth pad 794, the fifth pad 796, the first surface mount device 720 and the second surface mount device 721.

According to the present disclosure, the semiconductor package has at least following advantages. Miniaturization of IC packages is facilitated. In addition, an extra area for additional elements, devices or routing density is increased. Therefore, design flexibility of the semiconductor package is enhanced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
   a substrate;
   a first pad formed on the substrate;
   a second pad formed on the substrate;
   a first conductive element formed on the substrate;
   a surface mount device mounted on the first pad and the second pad;
   a first bonding wire electrically connecting a first bonding area of the first conductive element and a second bonding area of the first pad;
   a second conductive element formed on the substrate, and formed between the first pad and the first conductive element; and
   a heat-sink disposed on a top surface of the semiconductor package, having at least one cavity to accommodate the first pad, the second pad, a portion of the first conductive element, the first bonding wire and the surface mount device.

2. The semiconductor package according to claim 1, further comprising a solder resistance layer, covering a portion of the first bonding area and a portion of the second bonding area.

3. A semiconductor package, comprising:
   a substrate;
   a first pad formed on the substrate;
   a second pad formed on the substrate;
   a via-plug formed in the substrate, located in a space between the first pad and the second pad, and electrically connected to the second pad;
   a surface mount device mounted on the first pad and the second pad; and
   a heat-sink mounted on the substrate, having at least one cavity to accommodate the first pad, the second pad, the via-plug and the surface mount device.

4. The semiconductor package according to claim 3, further comprising a solder resistance layer covering the via-plug.

5. A semiconductor package, comprising:
   a substrate;
   a first conductive layer formed on the substrate and having a first pad and a second pad separated from the first pad;
   a second conductive layer formed on the substrate and having a third pad and a fourth pad electrically connected with the third pad;
   a first surface mount device mounted on the first pad and the third pad;
   a second surface mount device mounted on the second pad and the fourth pad; and
   a connection element electrically connecting the first pad and the second pad.

6. The semiconductor package according to claim 5, wherein the connection element comprises at least one bonding wire electrically connecting a first bonding area of the first pad and a second bonding area of the second pad, and the bonding wire lies across the first surface mount device.

7. The semiconductor package according to claim 6, further comprising a solder resistance layer covering a portion of the first pad to define the first bonding area and covering a portion of the second pad to define the second bonding area.

8. The semiconductor package according to claim 5, wherein the connection element comprises at least one via-plug formed in the substrate and electrically connecting the first pad with the second pad.

9. The semiconductor package according to claim 5, further comprising a heat-sink mounted on the substrate, having at least one cavity to accommodate the first pad, the second pad, the third pad, the fourth pad, the connection element, the first surface mount device and the second surface mount device.

10. The semiconductor package according to claim 5, further comprising a molding compound layer encapsulating the substrate, the first pad, the second pad, the third pad, the fourth pad, the connection element, the first surface mount device and the second surface mount device.

11. A semiconductor package, comprising:
a substrate;
a first conductive layer formed on the substrate and having a first pad and a second pad separated from the first pad;
a second conductive layer formed on the substrate and having a third pad and a fourth pad separated from the third pad;
a first surface mount device mounted on the first pad and the third pad;
a second surface mount device mounted on the second pad and the forth pad;
a first connection element electrically connecting the first pad and the second pad; and
a second connection element electrically connecting the third pad and the fourth pad.

12. The semiconductor package according to claim 11, wherein
the first connection element comprises at least one first bonding wire electrically connecting a first bonding area of the first pad and a second bonding area of the second pad;
the second connection element comprises at least one second bonding wire electrically connecting a third bonding area of the third pad and a fourth bonding area of the fourth pad.

13. The semiconductor package according to claim 12, further comprising a solder resistance layer covering portions of the first pad, the second pad, the third pad and the fourth pad to respectively define the first bonding area, the second bonding area, the third bonding area and the fourth bonding area.

14. The semiconductor package according to claim 11, wherein
the first connection element comprises at least one first via-plug formed in the substrate and electrically connecting the first pad with the second pad; and
the second connection element comprises at least one second via-plug formed in the substrate and electrically connecting the third pad with the fourth pad.

15. The semiconductor package according to claim 11, further comprising a heat-sink mounted on the substrate, having at least one cavity to accommodate the first pad, the second pad, the third pad, the fourth pad, the first connection element, the second connection element, the first surface mount device and the second surface mount device.

16. The semiconductor package according to claim 11, further comprising a molding compound layer encapsulating the substrate, the first pad, the second pad, the third pad, the fourth pad, the first connection element, the second connection element, the first surface mount device and the second surface mount device.

17. A semiconductor package, comprising:
a substrate;
a first conductive layer formed on the substrate and having a first pad and a second pad separated from the first pad;
a connection element electrically connecting the first pad with the second pad;
a second conductive layer formed on the substrate and having a third pad, a fourth pad and a fifth pad electrically connecting with each other through the second conductive layer;
a first surface mount device mounted on the first pad, the third pad and the fourth pad; and
a second surface mount device mounted on the second pad and the fifth pad.

18. The semiconductor package according to claim 17, wherein the conductive element comprises a via-plug formed in the substrate and electrically connecting the first pad with the second pad.

19. The semiconductor package according to claim 17, further comprising a heat-sink mounted on the substrate, having at least one cavity to accommodate the first pad, the second pad, the third pad, the fourth pad, the fifth pad, the first surface mount device and the second surface mount device.

20. The semiconductor package according to claim 15, further comprising a molding compound layer encapsulating the substrate, the first pad, the second pad, the third pad, the fourth pad, the fifth pad, the first surface mount device and the second surface mount device.

21. The semiconductor package according to claim 17, wherein the conductive element is part of the first conductive layer extending through a space between the third pad and the fourth pad beneath the first surface mount device, and the connection element has a width substantially less than or equal to 600 μm.

22. The semiconductor package according to claim 17, further comprising a solder resistance layer covering a portion of the connection element.

23. The semiconductor package according to claim 17, further comprising a solder resistance layer covering portions of the first conductive layer and the second conductive layer.

* * * * *